(12) United States Patent
Otremba (10) Patent No.: US 7,786,558 B2
(45) Date of Patent: Aug. 31, 2010

(54) SEMICONDUCTOR COMPONENT AND METHODS TO PRODUCE A SEMICONDUCTOR COMPONENT

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 1127 days.

(21) Appl. No.: 11/255,188

(22) Filed: Oct. 20, 2005

(65) Prior Publication Data

US 2007/0090523 A1    Apr. 26, 2007

(51) Int. Cl.
H01L 23/02 (2006.01)
(52) U.S. Cl. .................................. 257/678; 257/778
(58) Field of Classification Search ............... 257/678, 257/778
See application file for complete search history.

(56) References Cited

U.S. PATENT DOCUMENTS

| | | | |
|---|---|---|---|
| 6,459,147 B1 | 10/2002 | Crowley et al. | |
| 6,465,875 B2 | 10/2002 | Connah et al. | |
| 6,476,481 B2 | 11/2002 | Woodworth et al. | |
| 6,624,522 B2 | 9/2003 | Standing et al. | |
| 6,646,329 B2 | 11/2003 | Estacio et al. | |
| 6,767,820 B2 | 7/2004 | Standing et al. | |
| 6,777,800 B2 | 8/2004 | Madrid et al. | |
| 6,861,286 B2 | 3/2005 | Estacio et al. | |
| 6,870,254 B1 | 3/2005 | Estacio et al. | |
| D503,691 S | 4/2005 | Standing et al. | |
| 6,890,845 B2 | 5/2005 | Standing et al. | |
| 6,891,256 B2 | 5/2005 | Joshi et al. | |
| 6,893,901 B2 | 5/2005 | Madrid | |
| 6,930,397 B2 | 8/2005 | Standing et al. | |
| 2001/0052641 A1 | 12/2001 | Kuo et al. | |
| 2002/0125550 A1 | 9/2002 | Estacio | |

(Continued)

FOREIGN PATENT DOCUMENTS

| DE | 101 22 191 A1 | 8/2002 |
|---|---|---|
| JP | 358151039 | * 9/1983 |

OTHER PUBLICATIONS

Sawle A., et al., "DirectFET™ -A Proprietary New Source Mounted Power Package for Board Mounted Power", International Rectifier, Oxted, Surrey, England (1 pg.).

(Continued)

*Primary Examiner*—Long Pham
(74) *Attorney, Agent, or Firm*—Dicke, Billig & Czaja, PLLC (57) ABSTRACT

A semiconductor component and production method is disclosed. In one embodiment, the semiconductor component includes at least one vertical semiconductor power device having an upper side which includes at least one output electrode and a lower side which includes at least one input electrode and at least one control electrode. A contact clip with at least one peripheral rim portion is disposed on and electrically connected to the output electrode. The peripheral rim portion extends over and spaced from an edge of said semiconductor power device and terminating in a clip rim surface with is substantially coplanar with the source electrode and gate electrode. A thermally conductive, electrically insulating isolation layer is disposed on the upper surface of the contact clip and an electrically conductive layer is disposed on at least regions of isolation layer. The electrically conductive layer lies at a free potential and provides a connection surface for heat dissipating means.

25 Claims, 2 Drawing Sheets

U.S. PATENT DOCUMENTS

| | | |
|---|---|---|
| 2003/0001247 A1 | 1/2003 | Standing |
| 2003/0019080 A1 | 1/2003 | Anthony et al. |
| 2003/0052408 A1 | 3/2003 | Quinones et al. |
| 2004/0026796 A1 | 2/2004 | Standing et al. |
| 2005/0224960 A1 | 10/2005 | Standing et al. |
| 2006/0017174 A1 | 1/2006 | Otremba |

OTHER PUBLICATIONS

Sawle A., et al., "Novel Power MOSFET Packaging Technology Doubles Power Density in Synchronous Buck Converters for Next Generation Microprocessors", International Rectifier. (1 pg.).

* cited by examiner

SEMICONDUCTOR COMPONENT AND METHODS TO PRODUCE A SEMICONDUCTOR COMPONENT

FIELD OF THE INVENTION

The invention relates to semiconductor components, in particular to semiconductor components which include a semiconductor power device, and to methods for assembling semiconductor components.

BACKGROUND

Due to the increasing demand for higher power semiconductor components, inefficient heat dissipation from the semiconductor chip as well as the package is an increasing problem. Poor heat dissipation can lead to instability of the semiconductor device and limit its functionality. In order to improve the heat dissipation from a semiconductor component, it is known to mount an additional heat dissipater on the outer surface of the semiconductor package or even directly on the semiconductor chip itself. The heat dissipater can have the form of a metal plate. Additionally, the heat dissipater may include a plurality of outwardly extending fins in order to increase the surface area and further improve heat dissipation.

Lateral semiconductor devices have an active side, which includes integrated circuit devices and associated contact surfaces, and a passive rear side which does not include integrated circuit devices. Consequently, the passive rear side does not have to be electrically accessed. Therefore, in these types of semiconductor devices, it is simple to mount a heat dissipater directly on the passive rear surface of the semiconductor device.

However, it is complicated to mount a heat dissipater on vertical semiconductor power devices such as MOSFETs. In vertical semiconductor devices, the upper side as well as the opposing lower side of the semiconductor device provides a contact electrode. Therefore, an electrical contact is to be made between the upper side and an external circuit carrier such as a printed circuit board as well as the lower side of the device and the external circuit carrier. Consequently, vertical semiconductor devices do not have a rear side onto which a heat dissipater can be easily mounted in a similar fashion to lateral semiconductor devices.

It is, therefore, desirable to provide a semiconductor component which is suitable for vertical semiconductor power devices and which can simply and reliably accommodate an additional heat dissipater. It is also desirable that such a semiconductor component can be simply and cost-effectively assembled.

For these and other reasons there is a need for the present invention.

SUMMARY

The present invention provides a semiconductor component and production method. In one embodiment, the semiconductor component includes at least one vertical semiconductor power device having an upper side which includes at least one output electrode and a lower side which includes at least one input electrode and at least one control electrode. A contact clip with at least one peripheral rim portion is disposed on and electrically connected to said output electrode. The peripheral rim portion extends over and spaced from an edge of said semiconductor power device and terminating in a clip rim surface with is substantially coplanar with the source electrode and gate electrode. A thermally conductive, electrically insulating isolation layer is disposed on the upper surface of the contact clip and an electrically conductive layer is disposed on at least regions of isolation layer. The electrically conductive layer lies at a free potential and provides a connection surface for heat dissipating means.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the invention provides a semiconductor component which includes at least one vertical semiconductor power device having an upper side and a lower side. The upper side includes at least one output electrode and the lower side includes at least one input electrode and at least one control electrode. The input electrode and the control electrode have outer surfaces which are essentially coplanar and which provide surface mountable outer contact surfaces of the semiconductor component.

The semiconductor component also includes a contact clip having a flat web portion and at least one peripheral rim portion extending from an edge of the flat web portion. The bottom surface of the web is disposed on and electrically connected to the output electrode. The peripheral rim portion extends over and is spaced from an edge of the semiconductor power device and terminates in a clip rim surface. The clip rim surface is essentially coplanar with the outer surfaces of the input electrode and the control electrode and provides a surface mountable contact surface of the semiconductor component.

The semiconductor component also includes a thermally conductive, electrically insulating isolation layer, which is disposed on the upper surface of the contact clip, and an electrically conductive layer which is disposed on at least regions of isolation layer. The electrically conductive layer lies at a free potential and provides a connection surface for heat dissipating means.

The terms "upper" and "lower" are used to denote the orientation the of parts of the semiconductor component with respect to a higher level rewiring substrate such as a printed circuit board when the semiconductor component is mounted on and electrically connected to the printed circuit board. The term "outer" is used to denote surfaces which at least face towards the outer external surface of the component. Outer contact surfaces denote surfaces which form part of the outer surface of the semiconductor component.

The semiconductor component according to the invention has the advantage that the upper side and lower side of the vertical semiconductor power device are accessed by contact surfaces which are positioned on one side of the component and which are essentially coplanar. Therefore, the semiconductor component can be simply mounted to an external circuit carrier, such as a printed circuit board.

The upper side of the vertical semiconductor power device is electrically accessed by the contact clip which has a flat web portion disposed on, and electrically connected to, the output electrode of the upper surface. The peripheral portion of the contact clip extends over the edge of the power device and terminates in a clip rim surface which provides the surface mountable contact surface. The contact clip enables the output electrode to be electrically accessed from the opposing side of the semiconductor component.

The contact clip may be provided with a peripheral rim portion which extends from one or more sides of the flat web portion and may terminate in clip rim surfaces which are disposed on one or more sides of the MOSFET device. The arrangement of the peripheral portions and clip rim surfaces may be chosen to provide contact surfaces with a desired arrangement. The peripheral rim portion may extend on two opposing sides of the flat web portion to provide a contact clip with a general U-shape, for example. The peripheral rim portion may extend from all four sides of the flat web portion and provide a contact clip with a cup shape, for example.

In principle, heat dissipating means such as a heat dissipating plate could be attached to the upper surface of the contact clip. However, heat dissipaters are typically electrically conductive metallic plates. Therefore, this arrangement would have the disadvantage that the heat dissipater would lie at the same potential as the output electrode of the power device. Consequently, the functionality of the device would deteriorate which is undesired.

The semiconductor component according to the invention avoids the problems associated with this arrangement by providing an isolation layer on the upper surface of the contact clip. The isolation layer is thermally conductive and electrically insulating and provides a means of electrically isolating the contact clip while providing an efficient thermally conductive path.

An electrically conductive layer is disposed on at least regions of the isolation layer and provides an outer surface of the semiconductor component. The electrically conductive layer lies at a free potential due to the presence of the isolation layer. Consequently, the electrically conductive layer has the advantage that it provides a connection surface for electrically conductive heat dissipating means. Metallic heat dissipates can be mounted directly on the electrically conductive outer surface layer of the component without requiring an additional intermediate isolation layer and without affecting the functionality of the device.

The semiconductor component, according to the invention, has the further advantage that the electrical isolation provided by the isolation layer can be varied according to that required by a particular power device or a particular application. This can be achieved by appropriate selection of the material of the isolation layer and/or by varying the thickness of the isolation layer above the upper surface of the contact clip.

The semiconductor component according to the invention is also convenient for the customer or user of the component since the desired heat dissipating means may be simply attached to the potential free electrically conductive layer. Further electrical isolation does not have to be provided by the user as is the case by semiconductor components in which the contact clip provides an outer surface of the component and lies at the output electrode potential. The customer is able to choose the means by which the heat dissipation means is attached to the electrically conductive layer independently. Therefore, the user is able to select an electrically conductive adhesive, such as solder, or a thermally conductive but electrically insulating adhesive as desired.

In one alternative embodiment of the invention, the input electrode includes an input contact surface, a plurality of spacing elements and an input outer contact element. The spacing elements are electrically connected to the input contact surface and the input outer contact element. The input outer contact element provides the outer surface of the input electrode. The control electrode includes a control contact surface, at least one spacing element and a control outer contact element. The spacing element is electrically connected to the control contact surface and the control outer contact element. The control outer contact element provides the outer surface of the control electrode.

In this embodiment, the outer surface of the input outer contact element and the outer surface of the control outer contact element are essentially coplanar and provide surface mountable contact surfaces of the semiconductor component. The outer surface of the input outer contact element and the outer surface of the control outer contact element are, therefore, coplanar with the clip rim surface.

The input contact pad or area, the spacing elements and the input outer contact element are electrically conductive and include a metal or an alloy. The spacing elements create a gap between the contact surface and contact element.

This embodiment of the invention has the advantage that the outer surfaces of the input outer contact element and control outer contact element may have different lateral dimensions to that of the input electrode and control electrode respectively. Consequently, the semiconductor component may be provided with surface mountable contact surfaces which have a desired lateral size and arrangement which is independent of the lateral size and lateral arrangement of the input contact area and control contact area of the semiconductor device. Advantageously, in accordance with an aspect of the invention, the surface mountable contact surfaces may be provided with an arrangement corresponding to a standard footprint according to known JEDEC standards.

The peripheral rim portion of the contact clip may extend from one or more sides of the flat web portion of the contact clip as desired. The clip rim surface may, therefore, be arranged on one or more sides of the semiconductor power device as desired. Therefore, the clip rim surfaces and the outer surfaces of the input outer contact element and control outer contact element may together provide the semiconductor component with a footprint which conforms to a desired pattern or a JEDEC standard.

In one embodiment of the invention, the isolation layer has a thickness for providing a blocking voltage of around 20 V to around 1000 V. The thickness of the isolation layer is, therefore, varied according to the electrical isolation properties of the material comprising the isolation layer and the blocking voltage required by the semiconductor device and/or the application in which the semiconductor device is used.

The isolating layer may include a thickness of between around 0.1 µm to around 100 µm, or, preferably, between around 30 µm to around 40 µm. A thickness within this range provides a sufficient electrical isolation without unnecessarily increasing the thickness of the component. The electrically conductive layer may include a thickness of between around 0.1 µm to around 100 µm or, preferably, between around 30 µm to around 40 µm. A thickness within this range provides a good coverage and a reliable surface onto which a heat dissipater may be attached without unnecessarily increasing the materials cost and thickness of the component.

In one embodiment of the invention, the electrically conductive layer is disposed on substantially the whole of the isolation layer. This increases the surface area onto which the heat dissipater may be mounted and, therefore, improves the heat dissipation from the component.

The electrically conductive layer may include either a metal or an alloy and may include one or more of the elements copper, nickel, iron, tin, zinc, silver or gold. The electrically conductive layer may include a solder wettable material. This has the advantage that the heat dissipation means may be reliably mounted on the semiconductor component using a standard soft solder to provide an electrically conductive and thermally conductive bond. The solder wettable material may be provided as an additional layer on the upper surface of the electrically conductive layer and, in this case, provides an outer surface of the semiconductor component.

The isolation layer may include organic material, ceramic or polymeric material. These ceramic material may include alumina, zirconia or magnesia. The isolation layer may also include adhesive.

In a further embodiment of the invention, the isolation layer and the electrically conductive layer are provided in the form of a foil. The foil may include two layers. Advantageously, the isolation layer may be provided by an electrically insulating and thermally conductive adhesive. This avoids the use of a further adhesive layer between the output electrode and the electrically conductive layer, thus reducing the heat dissipation path and improving the heat dissipation from the component. The foil may be attached to the semiconductor component by simply mounting the electrically isolating layer on the upper surface of the contact clip.

In one embodiment, the flat web portion of the contact clip covers at least a portion of the upper surface of the output electrode. The flat web portion may, therefore, include one or more through holes or the openings. In an alternative embodiment, the web portion of the contact clip covers substantially the whole of the upper surface of the output electrode. This embodiment has the advantage that the interfacial area between the output electrode and the contact clip is maximised which reduces the contact resistance of the joint.

The contact clip may be mounted on the output electrode positioned on the upper surface of the semiconductor pad device by either soft solder, diffusion solder or an electrically conductive adhesive to provide a mechanical connection and electrical connection between the output electrode and the contact clip.

The invention also relates to a semiconductor component which further includes heat dissipating means. The heat dissipating means is mounted on the upper surface of the electrically conductive layer. The heat dissipating means may be attached to the upper surface of the electrically conductive layer by a layer of either soft solder or adhesive. The adhesive is thermally conductive and may also be electrically conductive. The heat dissipating means may have the form of a metal plate or a metal plate with outwardly extending fins, for example.

The vertical semiconductor power device may be a vertical MOSFET device. In this embodiment, the input electrode is a source electrode, the output electrode is a drain electrode and the control electrode is a gate electrode.

Alternatively, the vertical semiconductor power device may be a vertical bipolar junction transistor (BJP) device. In this embodiment among the input electrode is an emitter electrode, the output electrode is a collector electrode and the control electrode is a basic electrode.

In a further embodiment, the vertical semiconductor power device is a vertical isolated gate bipolar transistor (IGBT) device. In this embodiment, the input electrode is an emitter electrode, the output electrode is a collector electrode and the control electrode is a gate electrode.

In one embodiment, the semiconductor component according to the invention may also further include plastic encapsulation material. The plastic encapsulation material is typically an epoxy resin and may encapsulate at least the side faces of the semiconductor device. The epoxy resin may also include a portion of the lower outer surface of the semiconductor component and may be essentially coplanar with surface mountable contact surfaces of the component.

In one embodiment of the invention the isolation layer provided on the upper surface of the web portion of the contact clip may be provided by a layer of plastic encapsulation material. The outer side faces of the peripheral portion of the contact clip may also be encapsulated by the plastic encapsulation material. This embodiment has the advantage that the isolation layer may be fabricated during the same manufacturing process as the encapsulation of the semiconductor device is performed.

If a semiconductor component is provided with an input electrode and a control electrode which each include a contact surface, at least one spacing element and an outer contact element, the spacing elements, the contact surfaces and inner surfaces of the contact elements may be embedded in the plastic encapsulation material. This embodiment has the advantage that the contact surface positioned on the lower surface of the semiconductor power device is electrically insulated, in regions which do not include a spacing element, by the plastic encapsulation material from the contact element. This reduces the heat transfer from the contact surface to the contact element. This is advantageous in that less heat generated by the device is dissipated into the external circuit board. This reduces the effect of overheating of neighbouring components on the printed circuit board.

The invention also relates to methods for assembling semiconductor components. In one embodiment, at least one vertical semiconductor power device having an upper side and a lower side is provided. The upper side includes at least one output electrode and the lower side includes at least one input electrode and at least one control electrode. The input electrode and the control electrode have outer surfaces which are essentially coplanar and provide surface mountable outer contact surfaces of the semiconductor component. A contact clip having a flat web portion and at least one peripheral rim portion extending from an edge of said flat web portion is provided.

The bottom surface of the web of the contact clip is attached to and electrically connected to the output electrode so that the peripheral rim portion of the contact clip extends over and is spaced from an edge of the semiconductor power device. The peripheral rim portion terminates in a clip rim surface which is essentially coplanar with the outer surface of the input electrode and the outer surface of the control electrode and provides a surface mountable contact surface of the semiconductor component.

A thermally conductive, electrically insulating isolation layer is applied on the upper surface of the contact clip and an electrically conductive layer is applied on at least regions of the isolation layer. The electrically conductive layer lies at a free potential and provides a connection surface for heat dissipation means.

This method has an advantage that the assembly method up to the point at which the isolation layer is applied to the contact clip can be used to assemble components in which a connection surface of the heat dissipation means is not desired. The method is, therefore, flexible and assembly costs can be reduced.

In an alternative embodiment, a method for assembling a semiconductor component includes providing a vertical semiconductor power device having an upper side and a lower side. The upper side includes at least one output electrode and the lower side includes at least one input contact surface and at least one control contact surface.

At least one spacing element is deposited on the control contact surface and at least one spacing element is deposited on the input contact surface. The at least one spacing element on the input contact surface is bonded to an input outer contact element and the at least one spacing element on the control contact surface is bonded to a control outer contact element. The outer surface of the input outer contact element and the outer surface of the control outer contact element are essentially coplanar and provide surface mountable contact surfaces of the semiconductor component.

A contact clip having a flat web portion and at least one peripheral rim portion extending from an edge of the flat web portion is provided. The bottom surface of the web is attached to and electrically connected to the output electrode so that the peripheral rim portion extends over and is spaced from an edge of the semiconductor power device. The peripheral rim portion terminates in a clip rim surface which is essentially coplanar with the outer surfaces of the input outer contact element and the control outer contact element and provides a surface mountable contact surface of the semiconductor component.

A thermally conductive, electrically insulating isolation layer is applied to the upper surface of the contact clip and an electrically conductive layer is applied to at least regions of the isolation layer. The electrically conductive layer lies at a free potential and provides a connection surface for heat dissipating means.

Similarly, this method, up the application of the isolation layer to the upper surface of the contact clip, is also suitable for the assembly of components for which a connection surface for heat dissipation means is not desired. This method also has the advantage that it is flexible and, consequently, the assembly costs can be reduced.

The input outer contact element and control outer contact element may be advantageously provided by a leadframe. A vertical semiconductor power device is provided which includes an input contact surface and a control contact surface on one side and an output electrode on its opposing side. A plurality of individually laterally isolated spacing elements are deposited on the input contact surface and the control contact surface.

In this embodiment, a lead frame is provided which has the desired arrangement for the input outer contact element and control outer contact element. The lower surface of the semiconductor device including the spacing elements is then mounted on the lead frame so that the input contact surface is electrically connected via the spacing elements to the input outer contact element and the control contact surface is electrically connected via the spacing elements to the control outer contact surface.

A contact clip is then attached to the upper surface of the vertical semiconductor power device so that at least a portion of the web portion is attached to the output electrode and the peripheral portion extends over an edge of the power device and the clip rim surface lies in essentially the same plane as the outer surface of the input out of contact element and the control outer contact element.

The invention also relates to methods of attaching a connection means to a semiconductor component. The connections means includes an isolation layer and an electrically conductive layer. In this embodiment of the invention, an assembled semiconductor component comprising a vertical semiconductor power device and a contact clip according to one of the embodiments as previously described is provided. The upper surface of the contact clip provides an outer surface of the component at this stage of the assembly process.

In a separate process, an electrically insulating, thermally conductive isolation layer is applied to the upper surface of the web portion of the contact clip. An electrically conductive layer is applied to at least regions of the isolation layer to provide an electrically conductive layer lying at a free potential and to provide a connection surface for heat dissipation means.

This method has the advantage that an established production line can be used to manufacture the semiconductor components without the connection means. The connection means, comprising the isolation layer and the electrically conductive layer, can be provided in a separate process line for the semiconductor component for which an additional heat dissipation means, or the possibility of attaching at heat dissipating means, is desired. The manufacturing costs of the semiconductor components is, therefore, reduced.

For all of the embodiments, the isolation layer may be deposited by a vacuum deposition technique such as sputtering or evaporation. The electrically conductive layer may be provided by a foil which is attached to the pre-deposited isolation layer. The foil may be a metal foil which may also include an adhesive layer on one side by which the foil may be attached to the isolation layer.

Alternatively, the isolating layer and the electrically conductive layer may be provided in the form of a two layer foil which is applied to the upper surface of the web portion of the contact clip in a single process. The two layer foil may also be attached by an adhesive layer positioned between the isolation layer and the upper surface of the contact clip. Advantageously, the isolation layer may include or be made of an adhesive so that the two layer foil may be applied to two and attached to the upper surface of the contact clip directly. The isolation layer of the foil may be made of or include polyimide.

The bottom surface of the web portion of the contact clip may be attached to the output electrode by soft solder, diffusion solder or electrically conductive adhesive means to provide a low resistance electrical contact and reliable mechanical bond.

In a further embodiment, a thermally conductive adhesive layer may be provided on the upper surface of the electrically conductive layer. Alternatively a soft solder may be applied to the upper surface of the electrically conductive layer. An adhesive layer or soft solder layer provides a connection surface onto which a heat dissipater may be directly attached.

This enables a semiconductor component to be supplied to the user in a form such that the user may attach a metallic heat dissipater directly to the component as provided and then perform an appropriate treatment, for example a heat treatment, to attach the heat dissipater to the adhesive or soft solder. This may also be performed by a applying a preheated metallic heat dissipater to the semiconductor component, the heat of the heat dissipater being sufficient to melt the adhesive or soft solder and create a thermally conducting bond and reliable mechanical bond upon cooling.

If the semiconductor power device includes an input electrode which includes an input contact surface, spacing elements and an input outer contact elements and a control electrode which includes a control contact surface, spacing elements and a control outer contact element, the spacing elements may be deposited on the input contact surface and control contact surface by selective galvanic deposition. Galvanic deposition has the advantage that it is a relatively fast deposition process and material usage is minimized as only the material which is deposited on the device is consumed.

The input outer contact element and control outer contact and may be provided in the form of a leadframe or a leadframe strip which includes a plurality of device positions, each device position providing contact elements for a single semiconductor component. This enables a plurality of semiconductor power devices to be mounted on the leadframe in a single process step. The contact elements are held by tie bars or support bars within the leadframe so as to simplify the handling of the leadframe strip during the production. The tie bars are removed after the assembly process to electrically isolate the control contact element and input contact elements as well as the various semiconductor components from the leadframe strip.

The spacing elements may be attached to the corresponding input outer contact element and control outer contact element by diffusion soldering. Diffusion soldering has the advantage that a highly hermally stable bond is provided which also has a low electrical resistance. The diffusion solder bond may be provided by appropriate selection of the metals of the interface between the spacing elements and the respective contact element. Alternatively, a further metal layer may be provided on the spacing elements and/or the contact element in order to provide a diffusion solder bond upon the interface being subjected to an appropriate heat treatment.

In one embodiment of the invention, plastic encapsulation material is provided which is used to encapsulate at least the spacing elements. The side faces and the upper surface of the contact clip may also be encapsulated in the plastic encapsulation material. In this embodiment, the layer of plastic encapsulation material which covers the upper surface of the contact clip provides the isolation layer. In this embodiment, an electrically conductive layer can be applied directly to the upper surface of the encapsulated semiconductor component.

The encapsulation of the contact clip in plastic encapsulation material, such as an epoxy resin, is advantageous in that the thickness of the isolation layer covering the upper surface of the whether portion of the contact clip may be simply varied. Therefore, by varying the thickness of the isolation layer the desired blocking voltage, which may be from around 20 V to around 1000 V, can be provided.

The plastic encapsulation material may be applied so as to provide an isolation layer with the thickness of between 0.1 µm to around 100 m or, preferably, around 30 µm to around 40 µm.

The invention, therefore, provides a semiconductor component and methods of its assembly by which an additional heat dissipation means, such as a heat dissipater with fins, may be simply and reliably attached to the outer surface of the package of the semiconductor component. The outer surface of the package is provided with an electrically conductive connection surface which lies at a free potential and is not electrically connected to the contacts or semiconductor device within the package. The user of the semiconductor component can, therefore, attach a heat dissipater to the outer connection surface provided without having to provide additional electrical insulation between the heat dissipater and the semiconductor component. The user is, therefore, free to select the adhesive means as desired without affecting the functionality of the semiconductor power device.

Figure 1:
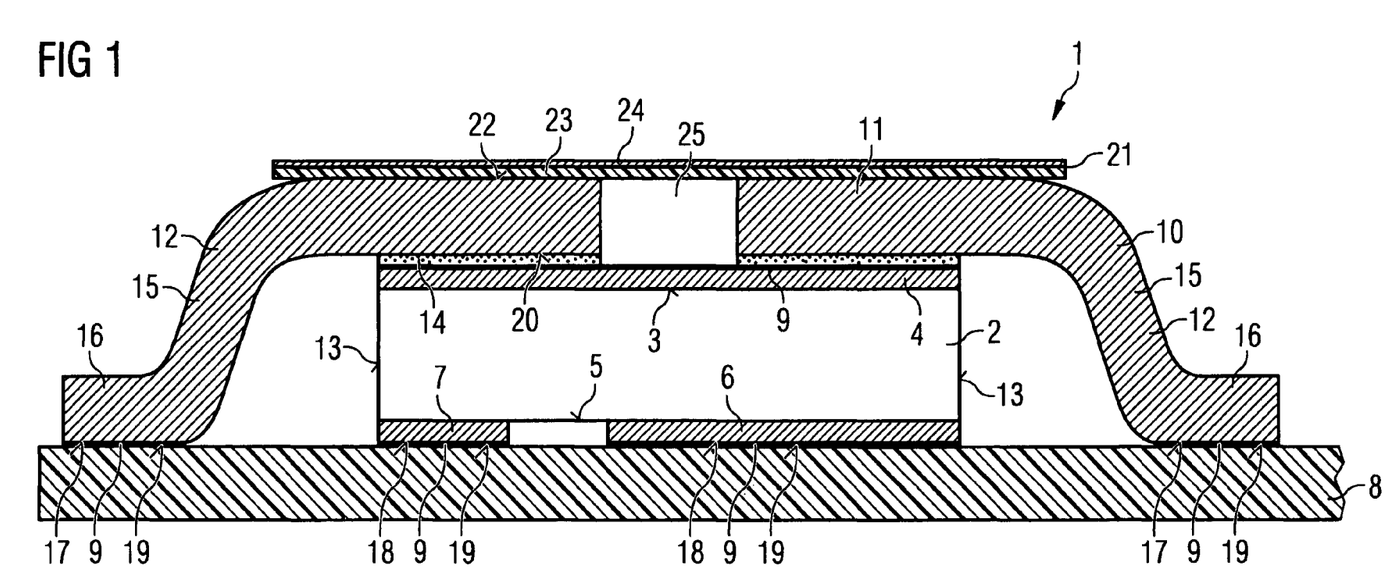
FIG. 1 illustrates a cross-sectional view of a semiconductor component according to a first embodiment of the invention.

FIG. 1 illustrates a cross-sectional view of a semiconductor component 1 including a vertical MOSFET device 2 according to a first embodiment of the invention. The vertical MOSFET device 2 has an upper side 3 which includes a drain electrode 4 and a lower side 5 which includes a source electrode 6 and a gate electrode 7. In this context, upper and lower are defined in relation to the orientation of the semiconductor component 1 when it is mounted on a circuit carrier such as a printed circuit board. Upper is used to denote the side of the MOSFET device 2 which faces upwards and away from the printed circuit board, indicated in FIG. 1 by 8, and lower is used to denote the side of the MOSFET device 2 which faces and is mounted on, and electrically connected to, the printed circuit board 8.

In this embodiment of the invention, the drain electrode 4 includes a layer of aluminium which is disposed directly on the upper surface 3 of the semiconductor body of the MOSFET device 2. The source electrode 6 and a the gate electrode 7 are disposed directly on the lower side 5 of the semiconductor body of the MOSFET device 2 and include aluminium. The outermost surface of the drain electrode 4, source electrode 6 and gate electrode 7 also includes a thin layer 9 of an easily solderable material, such as silver. The easily solderable outer surface layer 9 simplifies the mounting of the semiconductor component 1 on the printed circuit board 8.

The semiconductor component 1 further includes a contact clip 10 which includes a flat web portion 11 and a peripheral rim portion 12. The flat web portion 11 is laterally larger than the MOSFET device 2 on two opposing sides of the MOSFET device 2. Therefore, the peripheral rim region 12 extends over two opposing side faces 13 of the MOSFET device 2. The bottom surface 20 of the flat web portion 11 is disposed on, and electrically connected to, the drain electrode 4, positioned on the upper side 3 of the MOSFET device 2, by a layer 14 of soft solder.

The contact clip 10 has substantially a U-shape. Each opposing peripheral rim portion 12 includes a leg 15 which extends downwards from the flat web portion 11 in directions towards the bottom side 20 of the flat web portion. The legs 15 of the peripheral rim portion 12 are, therefore, spaced at a distance from two opposing side faces 13 of the MOSFET device 2. The legs 15 of the peripheral rim portion 12 each include a foot 16 which extends in a direction away from the side face 13 of the MOSFET device 2.

The lower outer surface 17 of each of the feet 16 of the peripheral rim portion 12 of the contact clip 10 lies in essentially the same plane as the outer surface 18 of the source electrode 6 and the outer surface 18 of the gate electrode 7. The outer surfaces 18 of the gate electrode 7, source electrode 6 and outer surfaces 17 of the feet 16 of the peripheral rim portion 12 of the contact clip 10, therefore, provide surface mountable contact surfaces 19. The contact clip 10 provides the electrical connection between the drain electrode 4 positioned on the upper side 3 of the MOSFET device 2 and the printed circuit board 8. As can be seen in FIG. 1, the surface mountable contact services 19 are essentially coplanar and are mounted on, and electrically connected to, the printed circuit board 8 by soft solder which is not shown in FIG. 1 for clarity. The lower outer surfaces 17 of the feet 16 also include an easily solderable layer 9.

According to the invention, a two layer foil 21 is disposed on the upper surface 22 of the flat web portion 11 of the contact clip 10. The foil 21 includes a thermally conductive, electrically insulating isolation layer 23 which is disposed directly on the upper surface 22 of the flat web portion 11 of the contact clip 10. The isolation layer 23 includes an adhesive. The foil 21 further includes an electrically conductive layer 24 which is disposed directly on the isolation layer 23. The isolation layer 23 electrically isolates the electrically conductive layer 24 from the contact clip 10. The contact clip 10 lies at the same potential as the drain contact 4 as the contact clip 10 is electrically connected by the soft solder layer 14 to the drain electrode 4. The outer surface of the electrically conductive layer 24 lies at a free potential, due to the isolation layer 23, and forms an outer surface of the semiconductor component 1. The electrically conductive layer 24 provides a connection surface onto which an additional heat dissipater (not shown in the figures) may be mounted without the use of further electrical isolation.

The electrically conductive layer 24 includes copper with an outer thin layer of silver which provides an easily solderable surface 9. In this embodiment of the invention, the heat dissipater can be simply mounted on the top of the semiconductor component 1 by soft solder. This provides an efficient thermally conductive bond between the heat dissipater and the semiconductor component 1.

In this embodiment of the invention, the flat web portion 11 of the contact clip 10 further includes a through-hole 25 which is positioned in approximately the lateral centre of the flat web portion 11. For ease of manufacture, the foil 21 is laterally approximately the same size as the flat web portion 11 of the contact clip 10 and covers the whole of the lateral area of the web portion 11. The foil 21, therefore, also covers the through hole 25.

Figure 2:
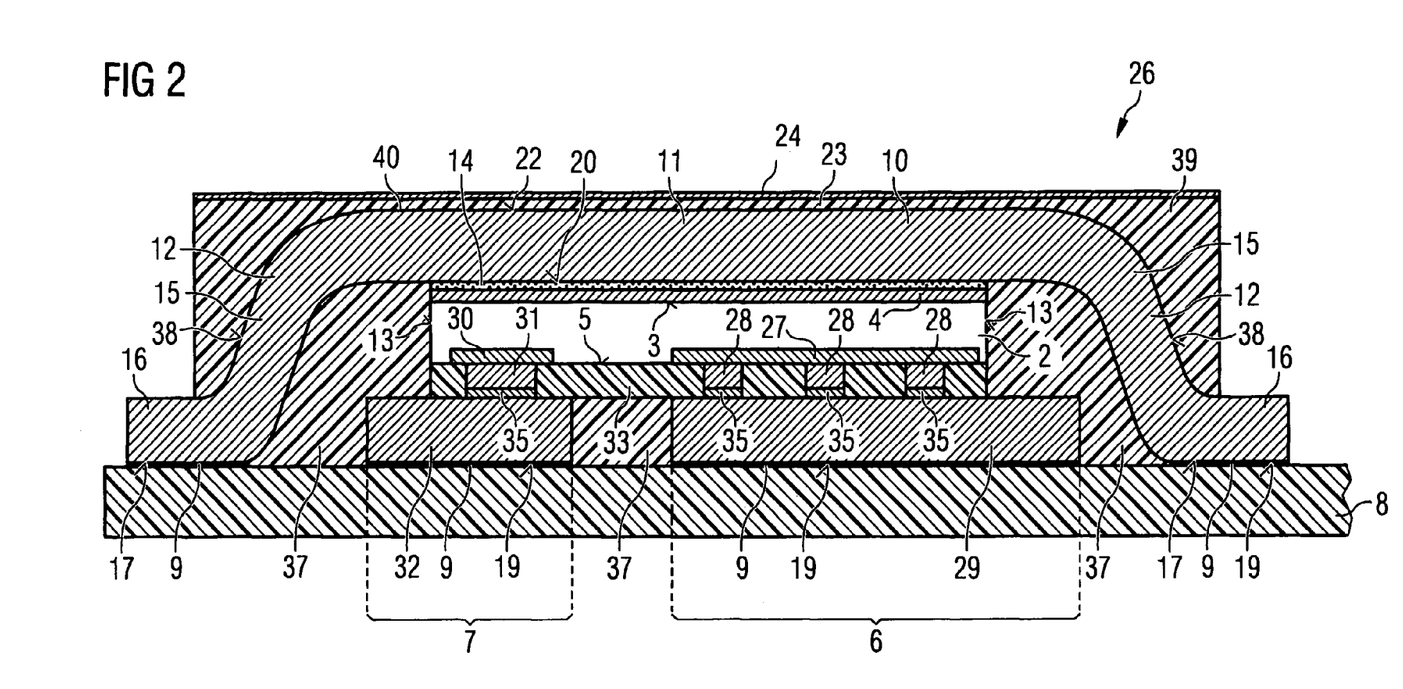
FIG. 2 illustrates a cross-sectional view of a semiconductor component according to a second embodiment of the invention.

FIG. 2 illustrates a semiconductor component 26 according to a second embodiment of the invention. The semiconductor component 26 includes a vertical MOSFET device 2 which includes a drain electrode 4 on its upper surface and a source electrode 6 and gate electrode 7 on its lower surface.

In the second embodiment of the invention, the source electrode 6 includes a source contact area 27 which is disposed directly on the lower surface 5 of the MOSFET device 2, a plurality of spacing elements 28 which are disposed on the source contact area 27 and a single contact element 29 which is disposed on the spacing elements 28. Similarly, the gate electrode 7 includes a gate contact pad 30, which is disposed directly on the lower surface 5 of the MOSFET device 2, a single spacing element 31 which is disposed on the gate contact surface 30 and a gate contact element 32 which is disposed on the spacing element 31.

The source contact element 29 is electrically connected to the source contact area 27 via the spacing elements 28. The gate contact element 32 is electrically connected to the gate contact pad 30 via the spacing element 31. The source electrode 6 and the gate electrode 7 are electrically isolated from each other and are not in mechanical connection.

The spacing elements 28 and 31 include a plurality of protrusions, which in this embodiment of the invention are laterally essentially square. The spacing elements 28 and 31 were deposited on the source contact area 28 and gate contact area 30 respectively by selective galvanic deposition. The regions between the spacing elements 28 and 31 and the remaining regions of the lower surface 5 of the MOSFET device 2 which do not include spacing elements are surrounded by a layer of epoxy resin 33 which has a thickness of approximately the height of the spacing elements 28 and 31. The outer surfaces 34 of the spacing elements 28 and 31 are essentially coplanar and are electrically isolated from one another.

A single source contact element 29 is disposed on the outer surfaces 34 of the plurality of spacing elements 28. The source contact element 29 is laterally larger than the source contact area 27 and protrudes laterally outside the lateral area or footprint of the MOSFET device 2. The source contact element 29 is mounted on, and electrically connected to, the outer surfaces 34 of the spacing elements 31 by a diffusion solder bond 35.

Similarly, the spacing element 31 positioned on the control contact area 30 is electrically connected to the control contact element 32 by a diffusion solder bond 35. The control contact element 32 is also laterally larger than the control contact area 30.

The configuration of the source electrode 6 and control electrode 7, according to the second embodiment of the invention, has the advantage that the outer surfaces 18 of the source electrode 6 and gate electrode 7 are provided by the outer surfaces 36 of the source contact element 29 and control contact element 32 respectively. These outer surfaces 36 form the surface mountable contact services 19 of the semiconductor component 26. Due to the provision of the spacing elements 28 and 31, the lateral size and position of the contact elements 29 and 32, which provide the surface mountable contact surfaces 19 of the semiconductor component 26, are independent of the lateral position and lateral size of the source contact area 27 and control contact area 30 disposed directly on the MOSFET device 2. Consequently, the semiconductor component 26 can be provided with surface mountable contact surfaces 19 which conform to a JEDEC standard. This simplifies the use of the semiconductor component 26 since the component 26 can be mounted on a printed circuit board, indicated in FIG. 2 by the numeral 8, which includes standard JEDEC contact surfaces.

The semiconductor component 26 also includes a contact clip 10 which, similarly to the embodiment shown in FIG. 1, includes a flat web portion 11 and peripheral rim portion 12 which extends on two opposing sides of the flat web portion 11. The bottom surface 20 of the flat web portion 11 is mounted on, and electrically connected to, the drain electrode 4 by a layer 14 of soft solder. Each peripheral rim region 12 includes a leg 15 and foot 16 which extends over and in the direction of the lower surface 5 of the MOSFET device 2. The lower surfaces 17 of the feet 16 are essentially coplanar with the outer contact surfaces 36 of the source contact element 29 and the control contact element 32. The outer surfaces 17, therefore, form the surface mountable contact surfaces 19 of the semiconductor component 26. In accordance with the advantages outlined above, the outer contact surfaces 17 of the contact clip 10, along with the outer contact surfaces 36 provided by the source contact element 29 and the control contact them and 32, provide contact surfaces which conform to a JEDEC standard.

In this embodiment of the invention, the side faces 13 of the MOSFET device 2 and the upper and side surfaces of the source contact element 29 and control contact element 32 are surrounded by, and embedded in, an epoxy resin 37. The side outer side faces 38 of the legs 15 of the contact clip 10 and the upper surface 22 of the flat web portion 11 of the contact clip 10 are also covered by epoxy resin 39. The epoxy resin 39 forms a layer 40 on the upper surface 22 of the flat web portion 11. This layer 40 provides the thermally conductive, electrically insulating isolation layer 23.

The isolation layer 23 provided by the layer 40 of epoxy resin 39 has a thickness of approximately 20 µm. In the region above the upper surface 22 of the flat web portion 11 of the contact clip 10, the epoxy resin 39 has a thickness sufficient to provide a blocking voltage of at least 500 V.

An electrically conductive layer 24 is provided on the upper surface of the epoxy resin 39. The electrically conductive layer 24 is provided in the form of a foil which has a thickness of approximately 20 µm. As the epoxy resin 29 provides the isolation layer 23, the electrically conductive layer 24 lies at a free potential and provides the semiconductor component 26 with an outer surface of the semiconductor component 26 which is suitable for the connection of a further heat dissipater. The heat dissipater is not shown in figures for clarity and may have any suitable form, for example a plate with fins on one side which extend upwards away from the device.

A semiconductor component 1, according to the invention, may be assembled by providing a vertical MOSFET Power device 2 which includes a drain electrode 4 on its upper side 3 and a source electrode 6 and gate electrode 7 which are positioned on the opposing lower side 5 of the MOSFET device. A contact clip 10 including a flat web portion 11 and peripheral rim 12 portion on two opposing sides of the flat web portion 11 is provided. Each peripheral rim portion 12 includes a leg 15 and foot 16.

The bottom surface 20 of the flat web portion 11 is mounted on, and electrically connected to, the drain electrode 4 by a layer of solder 14. The outer surfaces 17 of the feet 16 of the peripheral rim portion 12 of the contact clip 10 are essentially coplanar with the outer surfaces 18 of the source electrode 6 and gate electrode 7.

A foil 21 is provided which includes an isolation layer 23 and an electrically conductive layer 24. The isolation layer 23 is electrically insulating and thermally conductive and includes an adhesive. The foil 21 is attached to the upper surface 22 of the flat web portion 11 of the contact clip 10 by the adhesive of the isolation layer 23. The upper outer surface of the semiconductor component 1 is, therefore, provided by the electrically conductive layer 24 of the foil 21. The electrically conductive layer 24 provides a connection surface which lies at a free potential and which is suitable for mounting an additional heat dissipater without the use of a further electrical isolating layer between the semiconductor component 1 and the heat dissipater (not shown in the figures).

The semiconductor component 26 may be assembled using a similar method. In this method, a MOSFET device 2 is provided in which the lower side 5 of the MOSFET device 2 includes a source contact area 27 and a gate contact area 30. A plurality of spacing elements 28, 31 are provided on the source contact area 27 and gate contact area 30 respectively. A source contact element 29 is attached to the spacing elements 28 positioned on the source contact area 27. A gate contact element 32 is provided on the spacing elements 31 positioned on the gate contact surfaces 30.

The contact clip 10, isolation layer 23 and electrically conductive layer 24 may be provided using essentially the same method as that previously described.

A further layer of adhesive means (not shown in the figures) may be provided on the upper surface of the electrically conductive layer 24. The further layer may include solder or another adhesive means suitable for attaching a heat dissipation means, such as a metal heat dissipater, to the connection surface provided by the electrically conductive layer. In this embodiment, an outer surface of the component 1, 26 is provided by the additional layer of adhesive means.

The semiconductor components 2,26 may then be mounted to a higher level board, such as a printed circuit board, by the surface mountable surfaces 19 provided on the lower side of the semiconductor component 2,26. The surface mountable surfaces 19 are provided by the outer surfaces of the source electrode 6, gate electrode 7 and outer surfaces 17 of the foot 16 of the contact clip 10 in the semiconductor component 2 according to the first embodiment of the invention.

The semiconductor component 26 according to a second embodiment of the invention may be mounted on and electrically connected to a printed circuit board by the outer surfaces 36 of the source contact element 29 and gate contact element 36 and the outer surfaces 17 of the foot 16 of the peripheral rim portion 12 of contact clip 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
    at least one vertical semiconductor power device having an upper side which includes a drain electrode and a lower side which includes a source electrode and a gate electrode;
    a contact clip with at least one peripheral rim portion disposed on and having a lower surface electrically connected to the drain electrode, the peripheral rim portion extending over and spaced from an edge of said semiconductor power device and terminating in a clip rim surface with is substantially coplanar with the source electrode and gate electrode; and
    a thermally conductive, electrically insulating isolation layer disposed on an upper surface of the contact clip.

2. The semiconductor component of claim 1, comprising:
    an electrically conductive layer disposed on at least regions of the isolation layer.

3. The semiconductor component of claim 2, comprising wherein the electrically conductive surface lies at a free potential and provides a connection surface for heat dissipating.

4. The semiconductor component of claim 2, comprising:
    a heat dissipation mechanism in communication with the electrically conductive surface.

5. A semiconductor component comprising:
    at least one vertical semiconductor power device having an upper side and a lower side, wherein the upper side comprises at least one output electrode and wherein the lower side comprises at least one input electrode and at least one control electrode, and wherein the input electrode and the control electrode have outer surfaces which are substantially coplanar and provide surface mountable outer contact surfaces of the semiconductor component; and
    a contact clip having a flat web portion and at least one peripheral rim portion extending from an edge of said flat web portion, a bottom surface of said flat web portion being disposed on and electrically connected to said output electrode, said peripheral rim portion being extended over and spaced from an edge of said semiconductor power device and terminating in a clip rim surface, said clip rim surface being essentially coplanar with the outer surfaces of the input electrode and the control electrode and providing a surface mountable contact surface of the semiconductor component, wherein a thermally conductive, electrically insulating isolation layer is disposed on an upper surface of the contact clip, and wherein an electrically conductive layer is disposed on at least regions of the isolation layer, and wherein the electrically conductive layer lies at a free potential and provides a connection surface for heat dissipating means.

6. The semiconductor component according to claim 5, wherein said isolation layer has a thickness for providing a blocking voltage of around 20V to around 1000V.

7. The semiconductor component according to claim 5, wherein said isolation layer comprises a thickness of between 0.1 μm to 100 μm.

8. The semiconductor component according to claim 7, wherein said isolation layer comprises a thickness of between 30 μm to 40 μm.

9. The semiconductor component according to claim 5, wherein said electrically conductive layer comprises a thickness of between 0.1 μm to 100 μm.

10. The semiconductor component according to claim 9, wherein said electrically conductive layer comprises a thickness of between 30 μm to 40 μm.

11. The semiconductor component according to claim 5, wherein said electrically conductive layer is disposed on substantially the whole of the isolation layer.

12. The semiconductor component according to claim 5, wherein said electrically conductive layer comprises one of a group consisting of metal and an alloy.

13. The semiconductor component according to claim 12, wherein said electrically conductive layer comprises one or more of the elements Cu, Ni, Fe, Sn, Zn, Ag and Au.

14. The semiconductor component according to claim 5, wherein said electrically conductive layer comprises a solder wettable material.

15. The semiconductor component according to claim 5, wherein said isolation layer comprises one of a group consisting of organic material, a ceramic material and a polymer.

16. The semiconductor component according to claim 15, wherein said isolation layer comprises one of $Al_2O_3$, $ZrO_2$ and MgO.

17. The semiconductor component according to claim 5, wherein said isolation layer and the electrically conductive layer are provided by a foil.

18. The semiconductor component according to claim 5, wherein said flat web portion of said contact clip covers at least a portion of said upper surface of said output electrode.

19. The semiconductor component according to claim 5, wherein said flat web portion of said contact clip covers substantially the whole of said upper surface of said output electrode.

20. The semiconductor component according to claim 5, wherein the contact clip is mounted on the output electrode by one of a group consisting of soft solder, diffusion solder and electrically conductive adhesive.

21. The semiconductor component according to claim 5, further comprising heat dissipating means, said heat dissipating means being mounted on the upper surface of the electrically conductive layer.

22. The semiconductor component according to claim 21, wherein said heat dissipating means is attached to the upper surface of the electrically conductive layer by a layer of one of a group consisting of soft solder and adhesive.

23. The semiconductor component according to claim 5, wherein the semiconductor power device is a MOSFET device and the input electrode is a source electrode, the output electrode is a drain electrode and the control electrode is a gate electrode.

24. The semiconductor component according to claim 5, wherein the semiconductor power device is a BJT device, the input electrode is an emitter electrode, the output electrode is a collector electrode and the control electrode is a base electrode.

25. The semiconductor component according to claim 5, wherein the semiconductor power device is a IGBT device, the input electrode is an emitter electrode, the output electrode is a collector electrode and the control electrode is a gate electrode.

* * * * *